(12) United States Patent
Steuer

(10) Patent No.: US 10,509,063 B2
(45) Date of Patent: Dec. 17, 2019

(54) ELECTRICAL SIGNAL MEASUREMENT DEVICE USING REFERENCE SIGNAL

(71) Applicant: Fluke Corporation, Everett, WA (US)

(72) Inventor: Ronald Steuer, Hinterbruhl (AT)

(73) Assignee: FLUKE CORPORATION, Everett, WA (US)

( * ) Notice: Subject to any disclaimer, the term of this patent is extended or adjusted under 35 U.S.C. 154(b) by 67 days.

(21) Appl. No.: 15/824,270

(22) Filed: Nov. 28, 2017

(65) Prior Publication Data
US 2019/0162765 A1 May 30, 2019

(51) Int. Cl.
G01R 27/14 (2006.01)
G01R 1/02 (2006.01)
(Continued)

(52) U.S. Cl.
CPC ............. G01R 27/14 (2013.01); G01R 1/025 (2013.01); G01R 1/06788 (2013.01);
(Continued)

(58) Field of Classification Search
CPC .... G01R 27/14; G01R 1/06788; G01R 1/025; H01R 2201/20
(Continued)

(56) References Cited

U.S. PATENT DOCUMENTS 5,473,244 A 12/1995 Libove et al.
5,583,444 A 12/1996 Nakamura et al.
(Continued)

FOREIGN PATENT DOCUMENTS

EP 1 249 706 B1 9/2007
JP 6-28748 U 4/1994
(Continued)

OTHER PUBLICATIONS

Hioki, "3258 : Safety HiTESTER," Revised Edition 5, Hioki E. E. Corporation, Nagano Japan, 2 pages.
(Continued)

Primary Examiner — Giovanni Astacio-Oquendo
(74) Attorney, Agent, or Firm — Seed Intellectual Property Law Group LLP

(57) ABSTRACT

Systems and methods provide measurement of one or more electrical parameters (e.g., impedance) of a device under test (DUT) using an electrical parameter measurement device (e.g., multimeter, oscilloscope) that includes reference signal circuitry that generates, detects, and processes common mode reference signals. A measurement device may include a known common mode AC reference voltage source coupled to a common input terminal. During measurement of a DUT, circuitry may detect a signal at a voltage test input terminal and a signal at the common input terminal. The circuitry may process the first and second signals to determine one or more electrical parameters of the DUT, which one or more electrical parameters may be used to implement one or more features. The determined electrical parameters may be presented to an operator via a visual indicator device and/or may be communicated to an external device via a wired and/or wireless communications interface.

23 Claims, 9 Drawing Sheets

(51) Int. Cl.
*G01R 1/067* (2006.01)
*G01R 35/00* (2006.01)
*G01R 15/04* (2006.01)
*G01R 19/00* (2006.01)

(52) U.S. Cl.
CPC ......... *G01R 15/04* (2013.01); *G01R 19/0023* (2013.01); *G01R 35/005* (2013.01); *H01R 2201/20* (2013.01)

(58) Field of Classification Search
USPC .................. 324/715, 713, 691, 649, 600
See application file for complete search history.

(56) References Cited

U.S. PATENT DOCUMENTS

| | | | |
|---|---|---|---|
| 5,973,501 A | 10/1999 | Reichard | |
| 6,014,027 A | 1/2000 | Reichard | |
| 6,043,640 A | 3/2000 | Lauby et al. | |
| 6,072,690 A * | 6/2000 | Farooq | H01G 4/30 257/E23.067 |
| 6,118,270 A | 9/2000 | Singer et al. | |
| 6,118,293 A * | 9/2000 | Manhaeve | G01R 31/3004 324/750.3 |
| 6,141,374 A * | 10/2000 | Burns | H04B 1/7075 331/78 |
| 6,664,708 B2 | 12/2003 | Schlimak et al. | |
| 6,812,685 B2 | 11/2004 | Steber et al. | |
| 6,825,649 B2 | 11/2004 | Nakano | |
| 7,084,643 B2 | 8/2006 | Howard et al. | |
| 7,466,145 B2 | 12/2008 | Yanagisawa | |
| 8,054,061 B2 | 11/2011 | Prance et al. | |
| 8,222,886 B2 | 7/2012 | Yanagisawa | |
| 8,680,845 B2 | 3/2014 | Carpenter et al. | |
| 8,803,506 B2 | 8/2014 | Yanagisawa | |
| 9,063,184 B2 | 6/2015 | Carpenter et al. | |
| 9,201,100 B2 | 12/2015 | Yanagisawa | |
| 2002/0167303 A1 | 11/2002 | Nakano | |
| 2009/0058398 A1 | 3/2009 | Ibuki | |
| 2010/0060300 A1 | 3/2010 | Müller et al. | |
| 2010/0090682 A1 | 4/2010 | Armstrong | |
| 2010/0283539 A1 | 11/2010 | Yanagisawa | |
| 2012/0259565 A1 | 10/2012 | Oshima et al. | |
| 2013/0076343 A1 | 3/2013 | Carpenter et al. | |
| 2013/0113507 A1 | 5/2013 | Danesh et al. | |
| 2014/0035607 A1 | 6/2014 | Heydron et al. | |
| 2015/0145524 A1 * | 5/2015 | Duncan | G01R 31/024 324/538 |
| 2016/0054370 A1 * | 2/2016 | Fomin | G01R 31/025 324/509 |
| 2016/0109486 A1 | 4/2016 | Yanagisawa | |
| 2016/0178689 A1 * | 6/2016 | Okita | G01R 31/024 324/509 |
| 2017/0139001 A1 | 5/2017 | Lindell et al. | |

FOREIGN PATENT DOCUMENTS

| | | |
|---|---|---|
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2015-111087 A | 6/2015 |
| JP | 2016-3997 A | 1/2016 |
| WO | 2016/150872 A1 | 9/2016 |

OTHER PUBLICATIONS

Mitchell Instrument Company Inc., clipping from the Mitchell Catalogue, undated, 1 page.
Takahashi, "Clamp on Power Logger PW3365 : Safety Voltage Sensor PW9020," *Hioki Technical Notes* 1(1): 2015, 8 pages.
Tsang et al., "Dual capacitive sensors for non-contact AC voltage measurement," *Sensors and Actuators A* 167:261-266, 2011.
European Search Report, dated Apr. 11, 2019, for European Application No. 18208895.5-1022, 7 pages.

* cited by examiner

ELECTRICAL SIGNAL MEASUREMENT DEVICE USING REFERENCE SIGNAL

BACKGROUND

Technical Field

The present disclosure generally relates to measurement of electrical characteristics, and more particularly, to measurement of electrical parameters in electrical circuits.

Description of the Related Art

Voltmeters are instruments used for measuring voltage in an electrical circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

Conventional DMMs include a unitary housing or case to which one or more probes may be attached. Examples of conventional probes include test leads, current clamps, or combinations of both. The housings of conventional DMMs support the various electrical components for measuring and displaying the parameters. Examples of conventional displays include analog gauges, light emitting diodes, and liquid crystal displays. DMMs may also include various input components, such as buttons, dials, a touchscreen, etc.

With conventional DMMs, source impedance information for a device under test (DUT) is not known. Such information may be valuable to an operator of a DMM for various purposes, as discussed below with reference to one or more embodiments of the present disclosure.

BRIEF SUMMARY

An electrical parameter measurement device may be summarized as including: a voltage test input terminal operatively coupled to voltage measurement circuitry of the electrical parameter measurement device; a common input terminal operatively coupled to the voltage measurement circuitry of the electrical parameter measurement device; and reference signal circuitry, including: a common mode reference voltage source which, in operation, generates an alternating current (AC) reference voltage having a reference frequency, wherein the common mode reference voltage source is electrically coupled to the common input terminal; detection circuitry that, in operation, detects a first signal present at the voltage test input terminal; and detects a second signal present at the common input terminal; and processing circuitry that, in operation, receives the first and second signals from the detection circuitry; processes the first and second signals; and determines at least one electrical characteristic of a device under test that is electrically coupled to the voltage test input terminal and the common input terminal based at least in part on the processing of the first and second signals.

The electrical parameter measurement device may further include: a display, wherein, in operation, the processing circuitry causes the at least one electrical characteristic to be presented on the display. In operation, the processing circuitry may compare a phase of the first signal to a phase of the second signal to determine a measure of impedance of the device under test. The common mode reference voltage source may be electrically coupled to the common input terminal via a transformer. The common mode reference voltage source may be directly electrically coupled to the common input terminal. The AC reference voltage generated by the common mode reference voltage source may have a frequency that is greater than or equal to 500 Hz. The electrical parameter measurement device may include one of an analog multimeter, a digital multimeter, an analog oscilloscope, or a digital oscilloscope. In operation, the processing circuitry may determine the presence or absence of a ghost voltage in the device under test based at least in part on the processing of the first and second signals. In operation, the processing circuitry may analyze the first signal to determine a signal magnitude, and may determine a loop impedance between the voltage test input terminal and the common input terminal based at least in part on the signal magnitude of the first signal. In operation, the processing circuitry may determine at least one of an inductance value or a capacitance value for the device under test based at least in part on the processing of the first and second signals. In operation, the processing circuitry may determine the device under test is electrically coupled to each of the voltage test input terminal and the common input terminal based at least in part on the processing of the first and second signals. The detection circuitry may include: a first voltage divider circuit operatively coupled to the voltage test input terminal; a second voltage divider circuit operatively coupled to the common input terminal; a first analog-to-digital converter input terminal operatively coupled to an output of the first voltage divider circuit; and a second analog-to-digital converter input terminal operatively coupled to an output of the second voltage divider circuit. The detection circuitry may include: a first filter circuit operatively coupled to the voltage test input terminal, wherein, in operation, the first filter circuit passes signals that have a frequency within an expected range of frequencies for the device under test; and a second filter circuit operatively coupled to the voltage test input terminal, wherein, in operation, the second filter circuit passes signals that have the reference frequency of the common mode reference voltage source. The processing circuitry may implement a fast Fourier transform (FFT) to obtain a frequency domain representation of the first and second signals. The common mode reference voltage source may include a digital-to-analog converter (DAC).

A method of operating an electrical parameter measurement device, the electrical parameter measurement device including a housing, voltage measurement circuitry, a voltage test input terminal and a common input terminal operatively coupled to the voltage measurement circuitry, wherein the method may be summarized as including: causing a common mode reference voltage source to generate an alternating current (AC) reference voltage having a reference frequency, the common mode reference voltage source being electrically coupled to the common input terminal; detecting, via detection circuitry of the electrical parameter measurement device, a first signal present at the voltage test input terminal; detecting, via the detection circuitry, a second signal present at the common input terminal; processing, via processing circuitry of the electrical parameter measurement device, the first and second signals; and determining, via the processing circuitry, at least one electrical characteristic of a device under test that is electrically coupled to the voltage test input terminal and the common input terminal based at least in part on the processing of the first and second signals.

The method may further include: displaying, on a display of the electrical parameter measurement device, the determined at least one electrical characteristic. Processing the first and second signals may include comparing a phase of the first signal to a phase of the second signal to determine a measure of impedance of the device under test. Determining at least one electrical characteristic may include determining the presence or absence of a ghost voltage in the device under test based at least in part on the processing of the first and second signals. Determining at least one electrical characteristic may include determining at least one of an inductance value or a capacitance value of the device under test based at least in part on the processing of the first and second signals. Determining at least one electrical characteristic may include determining whether the device under test is electrically coupled to each of the voltage test input terminal and the common input terminal based at least in part on the processing of the first and second signals. Determining at least one electrical characteristic may include implementing a fast Fourier transform (FFT) to obtain a frequency domain representation of the first and second signals.

An electrical parameter measurement device may be summarized as including: a housing; voltage measurement circuitry disposed within the housing; a voltage test input terminal operatively coupled to the voltage measurement circuitry; a common input terminal operatively coupled to the voltage measurement circuitry; a common mode reference voltage source disposed within the housing and electrically coupled to the common input terminal, wherein, in operation, the common mode reference voltage source generates an alternating current (AC) reference voltage having a reference frequency; detection circuitry disposed within the housing, wherein, in operation, the detection circuitry detects first and second signals present at the voltage test input terminal and the common input terminal, respectively; and processing circuitry disposed within the housing, wherein, in operation, the processing circuitry processes the first and second signals to determine at least one electrical characteristic of a device under test that is electrically coupled to the voltage test input terminal and the common input terminal.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
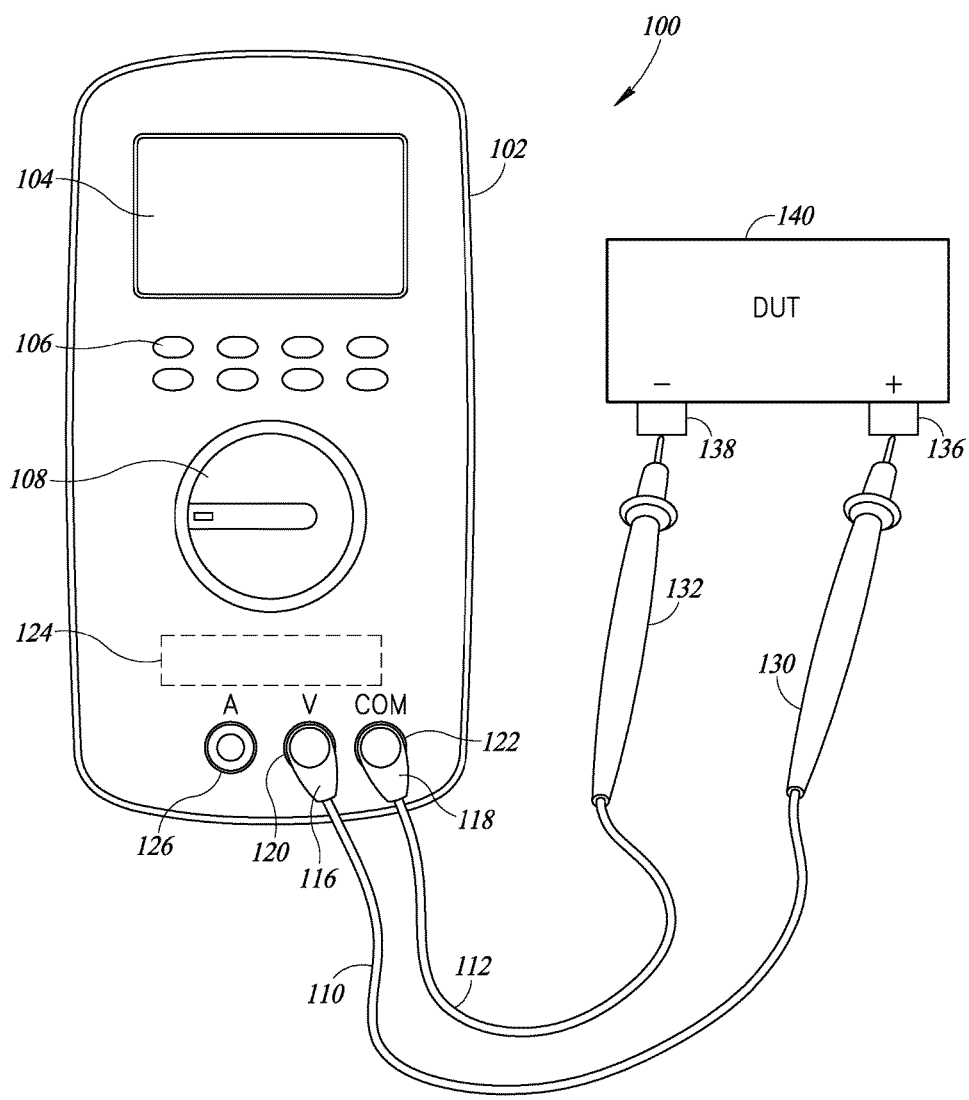
FIG. 1 is a pictorial diagram of an electrical parameter measurement device that includes reference signal circuitry, according to one illustrated implementation.

Systems and methods of the present disclosure advantageously provide for measurement of one or more electrical parameters (e.g., source impedance) of a device under test (DUT) using an electrical parameter measurement device that includes reference signal circuitry that is operative to generate, detect, and process common mode reference signals. Generally, an electrical parameter measurement device (e.g., multimeter, oscilloscope) may be provided that includes a common mode AC reference voltage source operatively coupled to a common input terminal of the electrical parameter measurement device. During measurement of a DUT, such as an AC voltage source, reference signal circuitry of the electrical parameter measurement device may detect one or more signals at a voltage test input terminal and one or more signals at the common input terminal. The reference signal circuitry may process the detected signals to determine one or more electrical parameters of the DUT, which one or more electrical parameters may be used to implement one or more features discussed herein. In at least some implementations, the determined electrical parameters may be presented to an operator via a visual indicator device (e.g., display, lights). The determined one or more electrical parameters may additionally or alternatively be communicated to an external device via a wired and/or wireless communications interface. The electrical parameters may include impedance, voltage, current, power, phase, frequency, harmonics, energy, etc.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising"

is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise. In addition, the headings and Abstract of the Disclosure provided herein are for convenience only and do not interpret the scope or meaning of the implementations.

FIG. 1 illustrates an electrical parameter measurement device (or "measurement device") 100 according to an embodiment of the present disclosure. It should be noted that, in the embodiment of FIG. 1, the measurement device 100 is configured as a portable digital multimeter (DMM). In other embodiments of the present application, the measurement device 100 may be configured as a portable analog multimeter, a desktop digital or analog multimeter, a clamp meter, a portable oscilloscope ("scope meter"), a desktop oscilloscope, or any other suitable measurement device.

As shown in FIG. 1, the measurement device 100 includes housing 102 that supports a display 104, manually operable buttons 106, and a rotatable mode selector switch 108. In some embodiments, other types of user input interfaces, e.g., a touch screen or a touch panel, may be used. A pair of test leads 110 and 112 includes plugs 116 and 118, respectively. The plugs 116 and 118 can be plugged into respective input terminals or jacks 120 and 122 of the measurement device 100, which are connected to two electrical leads (not shown in FIG. 1) of an internal circuit 124 inside the housing 102 of the measurement device 100. In the illustrated example, the input terminal 120 is a voltage test input terminal for measuring voltage in a DUT, and the input terminal 122 is a common input terminal. A current input terminal or jack 126 may also be plugged with a plug similar to one of the plugs 116 and 118, for measuring current in a DUT. The measurement device 100 may in some implementations include additional jacks that allow measurement of one or more other electrical parameters, such as resistance, under the selection of the selector switch 108.

The test leads 110 and 112 further include a first test probe 130 and a second test probe 132, respectively. The test probes 130 and 132 are connected to two test points 136 and 138, respectively, of a device under test (DUT) 140, e.g., a positive electrode and a negative electrode of an alternating current (AC) voltage source (e.g., an energized wire). Thus, the DUT 140 can be electrically connected to the internal circuit 124 through the test leads 110 and 112. The internal circuit 124 of the measurement device 100 is operative to perform the various measurements discussed herein based on electrical signals delivered through the test leads 110 and 112, and to generate measurement results. In some embodiments, the measurement results may be in a digital format, which can be displayed on the display 104, or may be communicated via a suitable wired and/or wireless communication interface to one or more external devices, for example.

Figure 2:
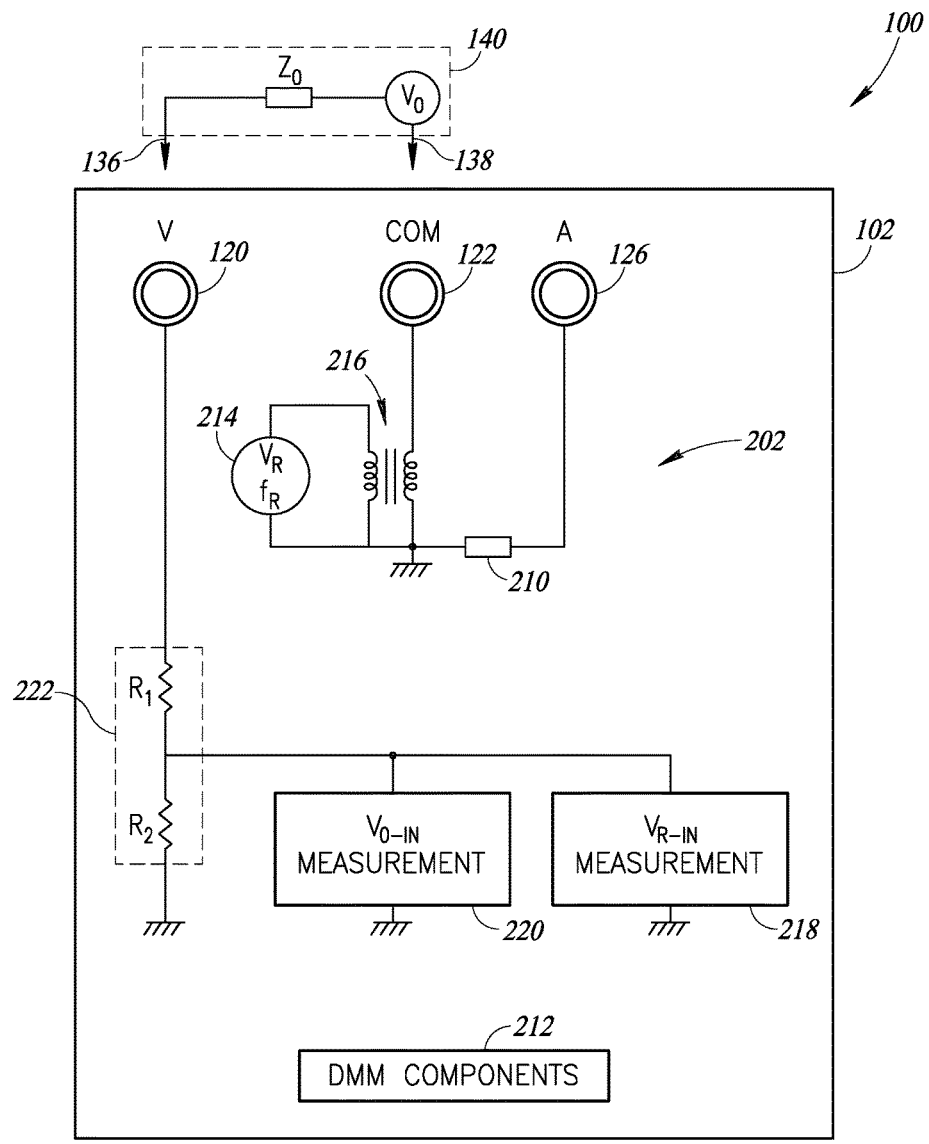
FIG. 2 is a schematic block diagram of the electrical parameter measurement device shown in FIG. 1.

FIG. 2 shows a schematic block diagram of the electrical parameter measurement device 100. The DUT 140 may be represented as a voltage source $V_O$ that has a serial source impedance $Z_O$. For example, the DUT 140 may be an energized wire of an electrical system that outputs an AC voltage having a particular magnitude $V_O$ (e.g., 110 VAC, 220 VAC) and a particular frequency (e.g., 50 Hz, 60 Hz, 100 Hz).

In the illustrated example, the measurement device 100 includes the voltage test input terminal 120, the common input terminal 122, and the current input terminal 126. In at least some implementations, the measurement device 100 may have more or fewer terminals. The current input terminal 126 may be electrically coupled to the common input terminal 122 via a shunt resistor 210 to allow for measurement of a current between the terminals 136 and 138 of the DUT 140. The terminals 120, 122 and 126 may be coupled (not shown) to conventional measurement device circuitry, designated "DMM components" 212, which may include voltage measurement circuitry, current measurement circuitry, resistance measurement circuitry, and/or other circuitry conventionally present in measurement devices, such as DMMs, oscilloscopes, etc.

The measurement device 100 includes reference signal circuitry 202 that includes a number of components operative to generate, detect, and process common mode reference signals. Generally, the reference signal circuitry 202 may include reference signal generation circuitry (e.g., PWM, digital-to-analog converter, sine wave generator), detection circuitry (e.g., voltage dividers, operational amplifiers, filters, multipliers, analog-to-digital converters (ADCs)) that receives or detects one or more signals, and processing circuitry (e.g., one or more microprocessors, microcontrollers, digital signal processors, application specific integrated circuits, programmable gate arrays) that analyzes received or detected signals to determine one or more electrical parameters or characteristics of a DUT.

In at least some implementations, the reference signal circuitry 202 may include a common mode AC reference voltage source 214 operatively coupled to the common input terminal 122 to generate a common mode signal at the common input terminal 122. The common mode AC reference voltage source 214 may comprise a ΧΑ digital-to-analog converter (DAC), for example. In the illustrated example, the common mode AC reference voltage source 214 is inductively coupled to the common input terminal 122 via a transformer 216. By coupling the common mode AC reference voltage source 214 to the common input terminal 122 via the transformer 216, the impedance of the common input terminal 122 may be kept relatively low so as to not influence other measurement functions, such as resistance or current measurement functions. Alternatively, in at least some implementations, the common mode AC reference voltage source 214 may be directly electrically coupled to the common input terminal 122, as shown in the examples provided in FIGS. 3 and 4.

The common mode AC reference voltage source 214 may have a reference frequency ($f_R$) that is higher than an expected frequency of the DUT 140. For example, the DUT 140 may have an expected frequency in the range of 40 Hz to 100 Hz (e.g., 50 Hz, 60 Hz), and the reference voltage source 214 may have a frequency in the range of 1000 Hz to 5000 Hz (e.g., 2500 Hz). The reference voltage ($V_R$) may have an amplitude selected based on the particular application. In at least some implementations, the amplitude of the reference voltage ($V_R$) is between 1 VAC and 10 VAC, for example. The amplitude and frequency of the reference voltage source 214 may be fixed or may be variable, as discussed further below.

The reference signal circuitry 202 of the measurement device 100 also includes a reference voltage ($V_{R-IN}$) measurement circuit 218 and optionally includes a signal voltage ($V_{O-IN}$) measurement circuit 220. The measurement circuits 218 and 220 may be coupled to the voltage test input terminal 120 via a voltage divider 222 that divides the voltage at the voltage test input terminal down to a level suitable for input to the measurement circuits 218 and 220. The voltage divider 222 may be formed by resistors $R_1$ and $R_2$, for example. In at least some implementations, the resistor $R_1$ has a resistance value of 999 kΩ and the resistor $R_2$ has a resistance value of 1 kΩ, such that the voltage divider 222 divides the voltage at the voltage test input terminal 120 by a factor of 1000.

In operation, the positive or high terminal 136 of the DUT 140 may be electrically connected (e.g., via test lead 110 of FIG. 1) to the voltage test input terminal 120, and the negative or low terminal 138 of the DUT may be electrically connected (e.g., via test lead 112 of FIG. 1) to the common input terminal 122 so that one or more electrical parameters of the DUT may be measured by the measurement device 100. When the DUT 140 is connected to the measurement device 100, the reference voltage $V_R$ generated by the reference voltage source 214 is superimposed onto the signal voltage $V_O$ of the DUT 140. As discussed further below, the reference voltage measurement circuit 218 may detect and process one or more signals present at the voltage test input terminal 120 that are due to the reference voltage source 214 and, based on such processing, may determine one or more electrical parameters for the DUT 140. For example, in at least some implementations, the reference voltage measurement circuit 218 measures the amplitude and phase of a component of a signal at the test voltage input terminal 120 that is due to the reference voltage source 214, compares the measurement to the known amplitude and phase of the reference voltage source 214, and determines the source impedance $Z_O$ or other parameter of the DUT 140. The signal current measurement circuit 220 may be operative to detect and process one or more signals present at the voltage test input terminal 120 that are due to the signal voltage $V_O$ of the DUT 140.

The functionality provided by the measurement device 100 and other measurement devices discussed herein may be used to implement a number of features including, but not limited to, source impedance determination, stray or "ghost" voltage detection, corroded contact detection, and/or other features.

Stray or ghost voltages occur from capacitive coupling, which takes place between energized circuits and non-energized, non-connected adjacent wiring. Because of this coupling effect and the high input impedance of a measurement device, conventionally it is not always possible to determine if the circuit under test is energized or de-energized. This creates confusion for the person performing the measurement. The most common place to encounter this situation is for unused cable runs or electrical wiring in existing conduit. When facilities or buildings are built and wired, it is common for electricians to pull extra wire through the conduit for future use. These wires are typically left unconnected until needed. Another example is an open ground or neutral on a branch circuit (e.g., 120 VAC branch circuit) or an open phase in a three phase power system.

A conventional high input impedance measurement device (e.g., DMM) presents virtually no load to a circuit under test. This is by design, so the measurement device does not load the circuit and affect the circuit measurements. However, in capacitive coupling situations, a high input impedance measurement device measuring between ground or neutral to an unconnected cable will indicate some amount of voltage present due to the measurement device effectively completing the circuit. Typically, this voltage reading may be as high as about 50 percent of the energized voltage in the same proximity. The measured ghost voltage is a static voltage, containing no real energy or current flow. For users who need to determine whether a circuit or connection is energized or not, this stray voltage reading presents a real source of confusion.

To prevent readings of ghost voltages, some measurement devices may be configured to have an input impedance that varies depending on what the input circuitry of the measurement device senses. For such devices, initially the input impedance is low (e.g., 2 kΩ). Thus, when the test leads of the measurement device are placed on the open circuit that contains the ghost voltage, the low input impedance causes the ghost voltage to dissipate, and the measurement device may indicate that no voltage is present. When the test leads are placed on a live circuit, however, the input circuitry senses the presence of a "hard" voltage and automatically adjusts the input impedance to a much higher value (e.g., 1 MΩ, 10 MΩ) and displays the actual voltage present.

In at least some implementations of the present disclosure discussed herein, ghost voltages may be detected using the reference signal circuitry 202. For example, upon detection of the presence of a ghost voltage, the measurement device 100 may output an indicator on the display 104 that notifies the operator that no "hard" voltage is present, so the operator will know that the circuit under test is not energized. This feature may have the advantage of simplifying the input circuitry required for a measurement device by not requiring a variable input impedance, while at all times maintaining a safe, high input impedance for the measurement device 100.

Another feature that may be implemented using the systems and methods discussed herein is the detection of corroded contacts on a DUT. For example, the reference voltage measurement circuit 218 may determine whether the measured reference voltage ($V_{R-IN}$) (or signal indicative thereof) due to the reference voltage source 214 does not exceed a defined threshold. If the reference voltage ($V_{R-IN}$) is below the defined threshold, the measurement device 100 may determine that the loop resistance of the measurement circuit is too high, which indicates that the test probe leads are not connected properly to the contacts of the DUT 140. Such poor connection is normally indicative of corroded contacts. In such implementations, the measurement device may provide a visual and/or audible indication to the operator that the connection is poor so the operator may take suitable remedial action. Additionally or alternatively, the measurement device 100 may detect that the test leads coupled to the measurement device are touching each other by detecting that the reference voltage $V_{R-IN}$ is above a defined limit, which indicates that the DUT 140 is bypassed by the direct connection of the test leads with each other.

Another feature that may be provided by the reference signal circuitry 202 is intrinsic inductance and capacitance measurements for the DUT 140. For example, the measurement device 100 may be operative to evaluate a phase shift of the detected reference voltage ($V_{R-IN}$) (or signal indicative thereof) relative to the known phase of the signal generated by the reference voltage source 214 to determine the inductance and/or the capacitance of the DUT 140 at the reference frequency $f_R$.

Figure 3:
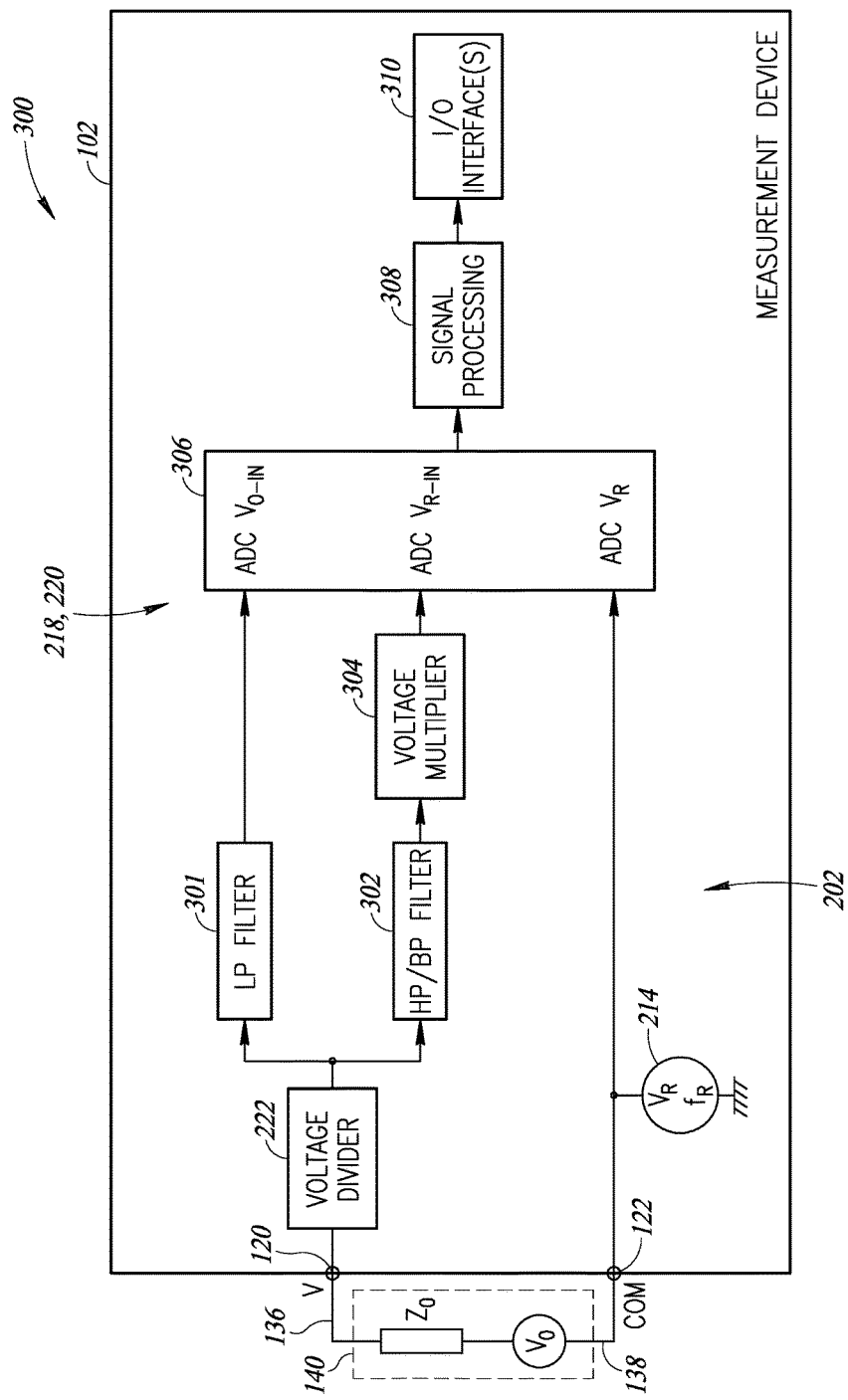
FIG. 3 is a functional block diagram of an electrical parameter measurement device that includes reference signal circuitry.

FIG. 3 illustrates a functional block diagram of an electrical parameter measurement device 300. The measurement device 300 may be similar or identical in many respects to the measurement device 100 discussed above.

In the illustrated implementation, the reference voltage source 214 is directly electrically connected to the common input terminal 122 to generate the common mode reference signal that has a reference voltage $V_R$ and a reference frequency $f_R$. As noted above, the reference voltage source 214 may also be inductively coupled to the common input terminal 122 via a transformer, for example, to keep the impedance of the common input terminal relatively low. The reference voltage source 214 may generate a reference signal that has a reference frequency $f_R$ that is above the expected bandwidth of the voltage present in the DUT 140. Since the reference voltage source 214 is connected to the common input terminal 122 of the measurement device 300, the reference voltage source generates a common mode signal in series with the DUT 140 when the terminals 136 and 138 of the DUT are electrically coupled to the terminals 120 and 122, respectively, of the measurement device.

As discussed above, the voltage divider circuit 222 is coupled to the voltage test input terminal 120 to allow the measurement device 300 to measure relatively high voltages (e.g., 100 VAC, 1000 VAC), and to provide input signals at relatively low voltage levels (e.g., 1 VAC, 10 VAC) that may be processed by the reference signal circuitry 202 or other circuitry. The output of the voltage divider circuit 222 may be split into two components by a low pass filter 301 and a high pass and/or band pass filter 302. In particular, the output voltage $V_O$ of the DUT 140 is isolated by the low pass filter 301 and is fed into an analog-to-digital converter (ADC) input, designated "ADC $V_O$," of an ADC 306. The measured reference voltage $V_{R-IN}$ is isolated by the high pass filter and/or band pass filter 302 and is fed into an ADC input, designated "ADC $V_{R-IN}$," of the ADC 306. In at least some implementations, the measured filtered reference voltage ($V_{R-IN}$) may be amplified by a voltage multiplier 304 to increase or compensate for a low signal value of the reference voltage due to the voltage divider circuit 222. As a non-limiting example, the low pass filter 301 may have a cutoff frequency of 500 Hz to pass the output voltage $V_O$ of the DUT 140 and block the reference voltage $V_{R-IN}$, and the band pass and/or high pass filter 302 may have a roll over frequency that is greater than 1 kHz to pass the reference voltage $V_{R-IN}$ and block the output voltage $V_O$. The particular specifications for the filters 301 and 302 may be selected dependent on the expected signals of the DUT 140 and the characteristics (e.g., $V_R$, $f_R$) of the reference voltage source 214.

To compare or analyze the detected input reference voltage $V_{R-IN}$, the output voltage $V_R$ of the reference voltage source 214 may also be fed into an ADC input, designated "ADC $V_R$," of the ADC 306.

In at least some implementations, the aforementioned separation and filtering of the output of the voltage divider circuit 222 may not be required. For example, if the ratio between the output voltage $V_O$ and the reference voltage $V_R$ is relatively low, such separation and filtering may not be required dependent on the resolution of the ADC 306. In at least some implementations, the reference voltage $V_R$ may be also be increased to provide more accurate measurements. However, increasing the reference voltage $V_R$ too much may have the disadvantages of increased power consumption and stray effects and influence of non-linear circuit components (e.g., diodes) of the DUT 140.

The measurement device 300 includes signal processing circuitry 308 that receives the digitized signals from the ADC 306. In at least some implementations, the signal processing circuitry 308 converts the digitized signals into the frequency domain by implementing a Fast Fourier Transform (FFT), for example. The signal processing circuitry 308 may determine the magnitude and phase shift of the measured reference voltage $V_{R-IN}$ compared to the known generated reference voltage $V_R$, which allows for a determination of the source impedance $Z_O$ of the DUT 140. Such determination may be made analytically, or may be made via one or more interpolation methods (e.g., bilinear interpolation) based on calibration data.

The signal processing circuitry 308 may also include an amplitude and phase correction unit to compensate for internal phase/gain shifts due to inevitable circuit stray capacitances, which improves accuracy. The frequency dependent values for this compensation function may be derived through a calibration cycle to determine the internal gain/phase deviation with a resistor-only based source DUT 140 (outputting $V_O$) without creating any external frequency dependency. The measured deviations in phase and gain over frequency may be stored for compensation (calibration process). Thus, the calibration factor(s) for gain and reference phase shift may be dependent on the frequency. In at least some implementations, a method of linear interpolation can be used to determine the actual calibration factors in between the stored calibration values.

The measurement device 300 also includes one or more input/output interfaces 310 that allow an operator to interact with the measurement device, and allow the measurement device to present measurement results to the operator. The input/output interface may include one or more inputs (e.g., buttons, dials, touch screen), one or more outputs (e.g., display, speaker, light), and/or one or more wired or wireless communications interfaces.

Figure 4:
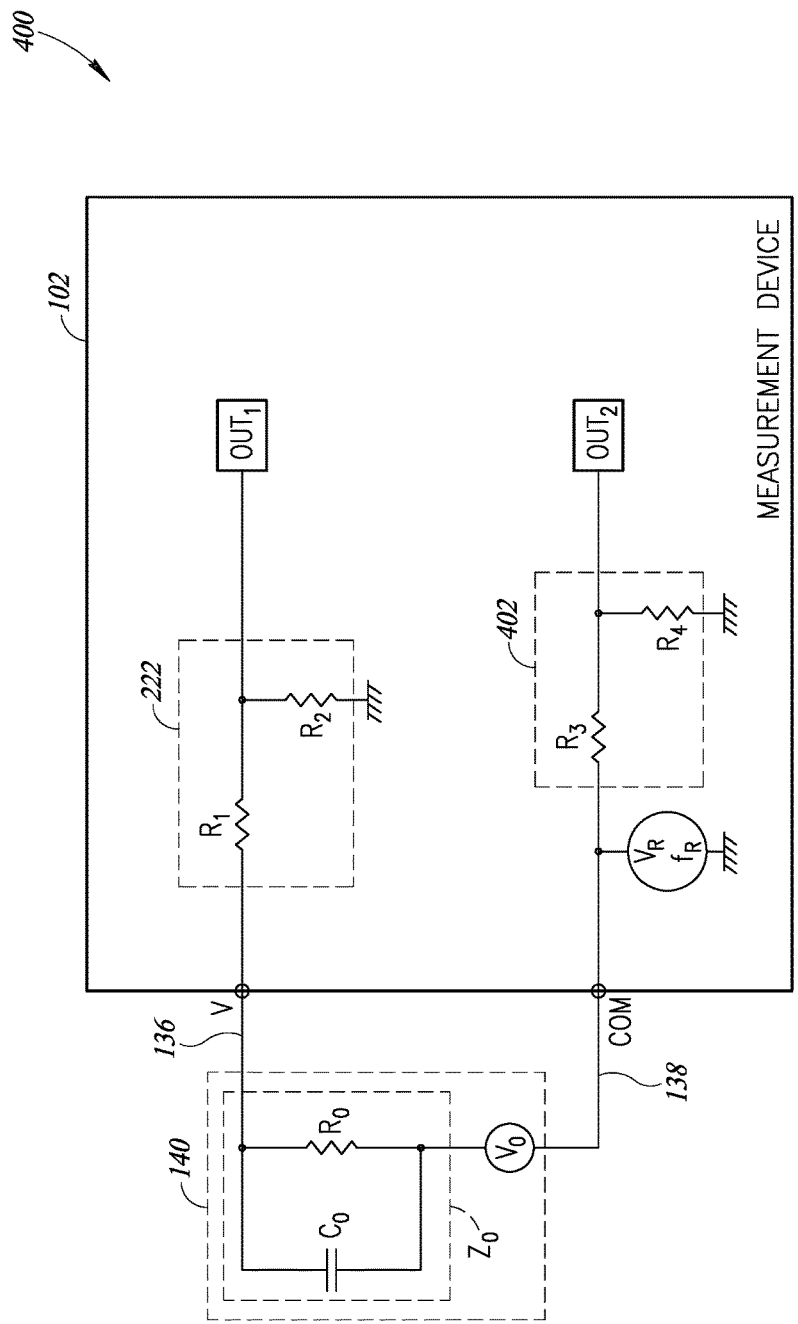
FIG. 4 is an example circuit diagram of an electrical parameter measurement device that includes reference signal circuitry.

FIG. 4 shows a simplified circuit schematic for portions of an electrical parameter measurement device 400. The measurement device 400 may be similar or identical in many respects to the measurement devices 100 and 300 discussed above. In this example, the source impedance $Z_O$ of the DUT 140 is modeled as a capacitor $C_O$ in parallel with a resistor $R_O$. Further, to provide a better comparison between the measured reference voltage ($V_{R-IN}$) and the generated reference voltage ($V_R$), in at least some implementations the generated reference voltage ($V_R$) is also fed to a voltage divider 402 that divides the reference voltage ($V_R$) by the same factor provided by the voltage divider 222 that divides the measured reference voltage ($V_{R-IN}$). Thus, both reference voltages have a similar range. The voltage divider 402 comprises resistors $R_3$ and $R_4$. As an example, the resistors $R_1$ and $R_3$ of the voltage dividers 222 and 402, respectively, may each have a value of 999 kΩ, and the resistors $R_2$ and $R_4$ may each have a value of 1 kΩ, so that each of the voltage dividers 222 and 402 divide an input voltage by a factor of 1000.

In the example of FIG. 4, the output of the voltage divider 222, which includes the measured reference voltage ($V_{R-IN}$), is designated as $OUT_1$, and the output of the voltage divider 402, which includes the generated reference voltage ($V_R$), is designated as $OUT_2$. Using suitable detection and processing circuitry (e.g., filter 301, ADC 306, signal processing circuitry 308), the signals at $OUT_1$ and $OUT_2$ may be analyzed to determine one or more electrical characteristics of the DUT 140.

Figure 7:
FIG. 7 is a graph that illustrates a first example output of a Fast Fourier Transform (FFT) generated by an electrical parameter measurement device.

FIG. 7 shows an example graph 700 of an FFT for the signal at $OUT_1$. For this example, the input resistance of the measurement device 400 is 1 MΩ (e.g., the resistor $R_1$ has a value of 999 kΩ, and the resistor $R_2$ has a value of 1 kΩ). The value of the capacitor $C_O$ of the source impedance $Z_O$ is 10 nF, and the value of the resistor $R_O$ is 100 MΩ. The output voltage $V_O$ of the DUT 140 measured by the measurement device 400 is 100 VAC with a frequency of 50 Hz. The reference voltage source 214 generates a reference voltage ($V_R$) that has a magnitude of 1 V and a reference frequency of 2,500 Hz. As shown in the graph 700 of FIG. 7, the measured output voltage ($V_{O-IN}$) has a magnitude of 100 mV and the measured reference voltage ($V_{R-IN}$) has a magnitude of 1 mV.

The signals at $OUT_1$ and $OUT_2$ may be analyzed in the frequency domain using the FFT. In particular, the phase shift and magnitude of the measured reference voltage ($V_{R-IN}$) is compared with the direct reference voltage ($V_R$), and the result allows the determination of the capacitive or inductive component of the source impedance $Z_O$. Table 1 below shows various example FFT magnitudes and relative phases for the measured signal at $OUT_1$ for source capacitance $C_O$ values of 1 nF, 10 nF, and 100 nF at both 50 Hz and 2,500 Hz.

TABLE 1

| $C_O$ | Frequency (Hz) | FFT Component | Phase (degrees) |
|---|---|---|---|
| 1 nF | 50 Hz | 2.9E−02 | 70.87° |
|  | 2500 Hz | 9.6E−04 | 3.64° |
| 10 nF | 50 Hz | 5.0E+01 | 17.64° |
|  | 2500 Hz | 2.5E+03 | 0.36° |
| 100 nF | 50 Hz | 1.0E−01 | 1.82° |
|  | 2500 Hz | 1.0E−03 | 0.04° |

Figure 10:
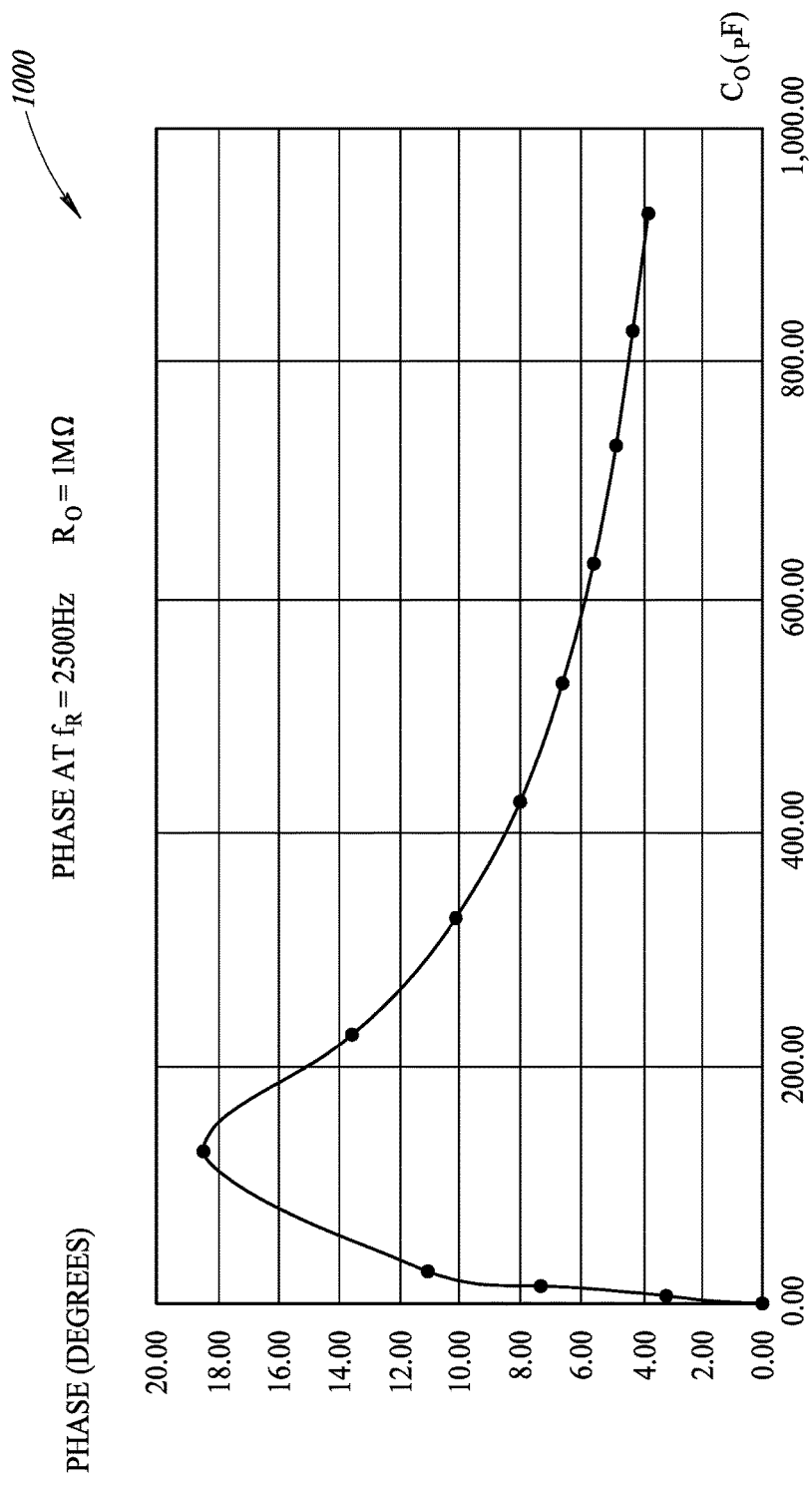
FIG. 10 is a graph that illustrates changes of a reference phase angle versus changes in the source capacitance $C_O$ of a device under test, for a frequency of 2500 Hz and a parallel source resistance of $R_O$=1 MΩ.

FIG. 10 is a graph that show changes of the reference phase angle versus changes in the source capacitance $C_O$, for a frequency of 2500 Hz and a parallel source resistance of $R_O$=1 MΩ.

Figure 8:
FIG. 8 is a graph that illustrates a second example output of a Fast Fourier Transform (FFT) generated by an electrical parameter measurement device.

FIG. 8 shows another example graph 800 of an FFT output for the signal at $OUT_1$ for a source impedance $Z_O$ that has a capacitance $C_O$ of 100 pF and a resistance $R_O$ of 1 GΩ. In this example, at the reference frequency $f_R$ of 2500 Hz, the $OUT_1$ signal has an FFT component of 0.84 mV and a phase angle of 32.47°.

As discussed above, using the determined magnitude and phase angle, the source impedance $Z_O$ may be calculated analytically, or the result including stray effects may be calibrated using various RC combinations in series with the signal voltage source (e.g., DUT 140) together with an interpolation process, such as a bilinear interpolation process that uses the determined voltage and phase angle as inputs.

In at least some implementations of the measurement devices discussed herein, the reference voltage ($V_R$) may have multiple frequencies to reduce signal harmonics or interharmonic influence on the measured reference voltage ($V_{R-IN}$) caused by higher frequency components of the signal voltage ($V_O$). For example, the reference voltage source (e.g., reference voltage source 214) may be periodically switched off and the FFT frequency bins around the multiple reference frequencies may be analyzed and checked against a relative limit. The lowest value may be used to define a selected reference frequency ($f_R$) that is least disturbed by the signal voltage ($V_O$) or other influencing factors.

In at least some implementations, the switching off of the reference voltage source may not necessarily generate a gap in the measurement stream. For example, the signal current ($I_O$) may still be measured when the reference voltage source is switched off, and the reference voltage ($V_{R-IN}$) measured during the previous interval may be used to estimate the reference voltage for the interval in which the reference voltage source is switched off.

To further reduce any errors caused by the bandwidth influence of the variable frequencies of the reference frequency ($f_R$), calibration factors may be modified by multiplying them with a constant calibration factor that is dependent on the reference frequency ($f_R$) that is determined in a calibration cycle by storing the deviation of the calibration factor at different reference frequencies in relation to a default reference frequency (e.g., 2419 Hz).

In addition to the reference frequency switching discussed above, other dedicated signal characteristics of the reference signal may be used. Examples include amplitude or frequency modulation, synchronous or pseudo-stochastic switching, quadrature modulation, phase switching, etc.

As an example of using a modulated signal, the reference signal may be modulated with a modulation frequency $f_m$. In at least some implementations, the modulation frequency $f_m$ may be selected to lie exactly at an integer number of FFT bins. For example, for a 100 ms FFT interval, such frequencies would be frequencies of 10 Hz, 20 Hz, 30 Hz, etc. In the absence of noise at the carrier or reference frequency ($f_R$), this results in two symmetrical side bands, one on each side of the reference frequency.

If both of the two side bands do not have the same magnitude, it can be determined that the reference signal is disturbed (e.g., by the signal voltage ($V_O$)). This is a relatively simple identification process that does not require switching the reference voltage source 214 off. If the reference signal is found to be disturbed, the measurement device may shift the reference frequency by an amount Δf and again check the side bands for symmetry until a suitable (undisturbed) reference frequency is identified.

To further speed up the process, in at least some implementations, multiple reference frequencies may be used at the same time. This frequency mixture can be created either by predetermined tables and bit streaming (e.g., ΣΔ DAC bit streaming), or by analog addition of low pass filtered outputs of pulse width modulators (PWM), for example. If PWMs are used, a pair of PWMs may provide a reference frequency and a modulation frequency, and multiple pairs of PWMs may be used to provide multiple reference frequencies and multiple corresponding modulation frequencies.

Figure 5:
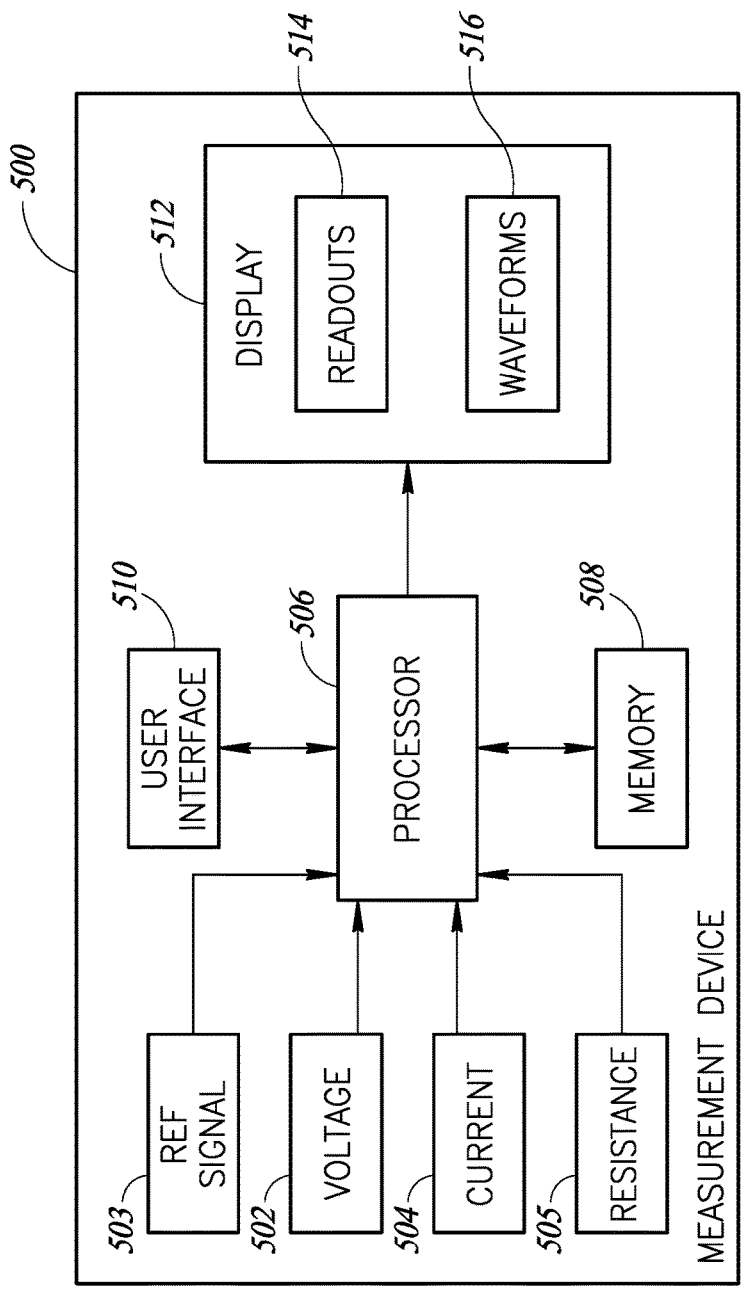
FIG. 5 is a schematic block diagram of an electrical parameter measurement device.

FIG. 5 is a schematic block diagram of a measurement device or instrument 500 which provides the reference signal measurement functionality discussed herein (e.g., with regard to measurement devices 100, 300, 400). The measurement device 500 may also determine one or more AC electrical parameters (e.g., power, energy, frequency, harmonics) derived from voltage and/or current measurements. The measurement device 500 includes voltage sensor circuitry 502, current sensor circuitry 504, reference signal circuitry 503, and resistance sensor circuitry 505 that are each communicatively coupled to a processor 506.

The processor 506 may include one or more logic processing units, such as one or more central processing units (CPUs), microprocessors, digital signal processors (DSPs), application-specific integrated circuits (ASICs), field programmable gate arrays (FPGAs), etc. The measurement device 500 may also include memory 508 communicatively coupled to the processor 506 which stores at least one of instructions or data thereon. The memory 508 may include one or more solid state memories, for instance flash memory or solid state drive (SSD), which provide nonvolatile storage of computer-readable instructions, data structures, program modules and other data for the measurement device 500. Although not depicted, the measurement device 500 can employ other nontransitory computer- or processor-readable media, for example a hard disk drive, an optical disk drive, or memory card media drive.

The measurement device 500 may include a user interface 510 which may include any number of inputs (e.g., buttons, dials, switches, touch sensor, touchscreen) and any number of outputs (e.g., display, LEDs, speakers, buzzers). The measurement device 500 may also include one or more displays 512 which present readouts 514 and/or waveforms 516.

The processor 506 may provide readouts 514 of one or more of the measured or derived parameters, and may provide graphical representations of one or more characteristics. Such graphical representations may include waveforms, harmonic bar graphs, etc. Example signal characteristics which may be presented via the display 512 include source impedance, voltage, current, frequency, power parameters (e.g., watts, KVA), phase, energy, harmonics, phase sequence detection, etc.

Figure 6:
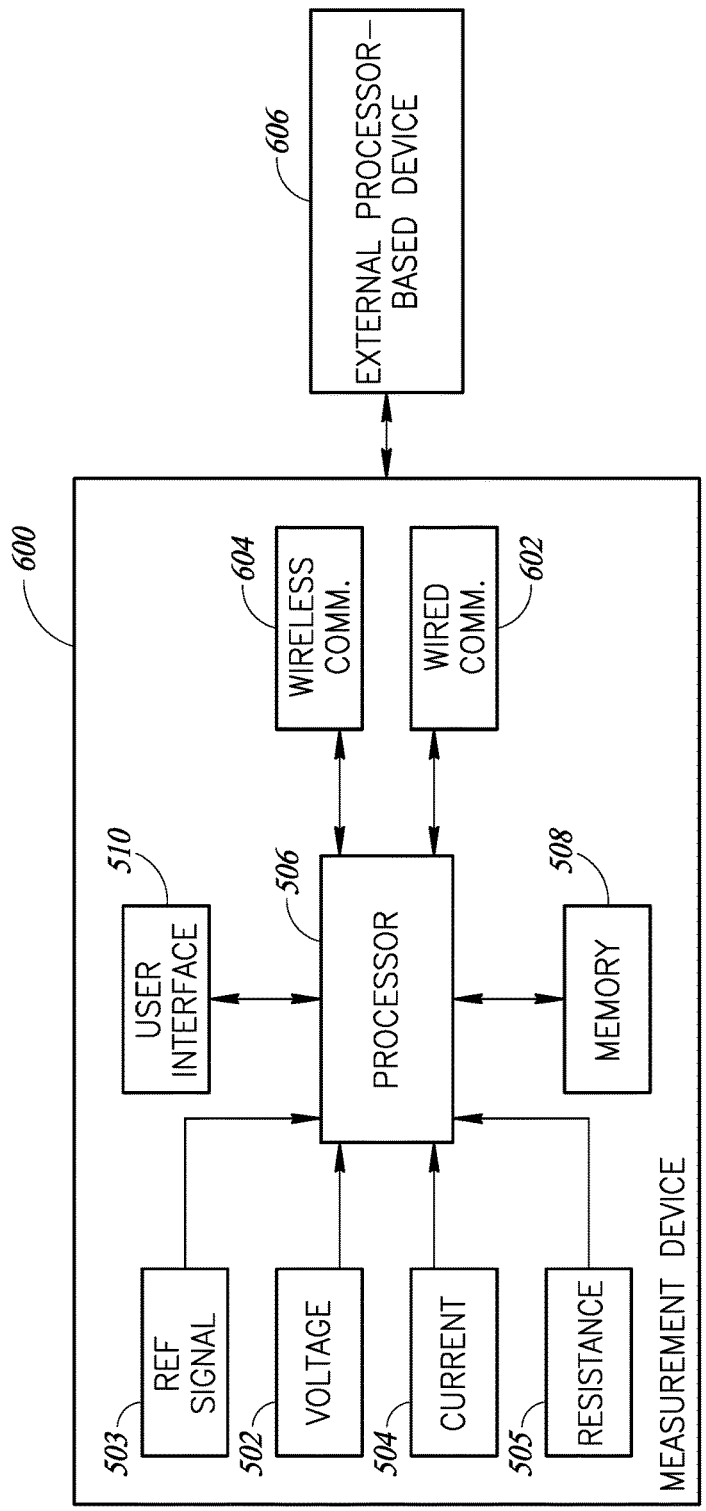
FIG. 6 is a schematic block diagram of an electrical parameter measurement device which operates as a remote sensor.

FIG. 6 is a schematic block diagram of a measurement device or instrument 600 which provides the measurement functionality discussed herein (e.g., with regard to measurement devices 100, 300, 400). The measurement device 600 is similar or identical to the measurement device 500 of FIG. 5 in many respects, so only relevant differences are discussed herein for the sake of brevity.

In this implementation, the measurement device 600 may not include a display and instead may be used as a "leave behind" sensor to monitor electrical equipment remotely via an external processor-based device 606. Such processor-based device 606 may include various types of devices, such as smartphones, tablet computers, laptop computers, wearable computers, servers, cloud computers, etc. The external processor-based device 606 may include a display to present data gathered by the measurement device 600 over a period of time (e.g., minutes, hours, days, weeks, years).

To communicate with one or more external processor-based devices, the measurement device may include one or more wired communications interfaces 602 and/or one or more wireless communications interfaces 604. Non-limiting examples of wireless communications interfaces 604 include Wi-Fi®, Bluetooth®, Bluetooth® Low Energy, Zigbee®, 6LoWPAN®, Optical IR, wireless HART, etc. Non-limiting examples of wired communications interfaces 602 include USB®, Ethernet, PLC, HART, MODBUS, FireWire®, Thunderbolt®, etc.

In addition to sending data to the external device 606, in at least some implementations the measurement device 600 may receive at least one of data or instructions (e.g., control instructions, firmware updates) from the external device 606 via the wired communications interface 602 and/or the wireless communications interface 602.

Figure 9:
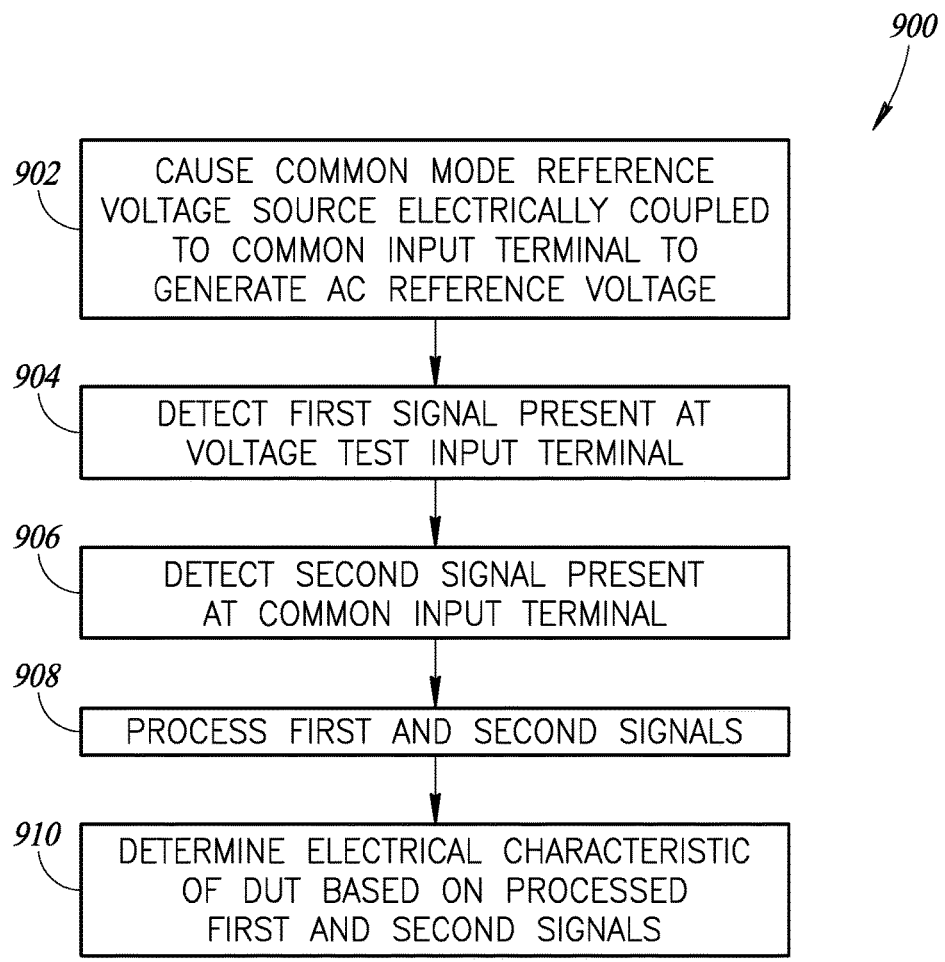
FIG. 9 is a flow diagram for a method of operating an electrical parameter measurement device to determine at least one electrical parameter of a device under test.

FIG. 9 illustrates a flow diagram for a method 900 of operating a measurement device to determine at least one electrical characteristic of a DUT. The method 900 may be implemented using any of the measurement devices discussed herein.

At 902, a measurement device, or circuitry thereof, may cause a common mode reference voltage source that is electrically coupled to a common input terminal to generate an AC reference voltage $V_R$ having a reference frequency $f_R$.

As discussed above, the reference voltage source may generate a reference voltage that has a frequency that is higher than the expected frequencies to be present in the DUT.

At 904, detection circuitry of the measurement device may detect a first signal present at the voltage test input terminal. For example, the detection circuitry may detect a first signal that includes components including a measured signal or output voltage $V_O$ for the DUT as well as the measured reference voltage $V_{R-IN}$. At 906, detection circuitry of the measurement device may detect a second signal present at the common input terminal. The second signal may be representative of the reference voltage $V_R$ generated by the reference voltage source. Both of the first and second signals may be measured within the same time period such that they are not being influenced by voltage variations (e.g., no consecutive sequential measurements).

At 908, processing circuitry of the measurement device may process the first and second signals. Such processing may including filtering, scaling, conditioning, converting from analog to digital, transforming from the time domain to the frequency domain (e.g., via an FFT), etc., as discussed above. In at least some implementations, an inverse notch filter only amplifies the usually quite low reference voltage signal, which may improve measured signal quality.

At 910, the processing circuitry may determine at least one electrical characteristic of a device under test that is electrically coupled to the voltage test input terminal and the common input terminal based at least in part on the processing of the first and second signals. For example, the processing circuitry may compare a phase of the first signal to a phase of the second signal to determine a measure of impedance of the DUT analytically or using calibration data. As other examples, the processing circuitry may determine the presence or absence of a ghost voltage, may determine at least one of an inductance value or a capacitance value for the DUT, or may determine whether the DUT is properly electrically coupled to each of the voltage test input terminal and the common input terminal.

Once the one or more electrical characteristics have been determined, the measurement device may present such electrical characteristics to an operator. For example, the measurement device may present such electrical characteristics to an operator via a display, or may send the electrical characteristics to one or more external devices via a wired and/or wireless communications interface.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a measurement device may not utilize a processor to execute instructions. For example, a measurement device may be hardwired to provide some or all of the functionality discussed herein. Additionally, in at least some implementations a measurement device may not utilize a processor to cause or initiate the different functionality discussed herein.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An electrical parameter measurement device, comprising:
    a voltage test input terminal operatively coupled to voltage measurement circuitry of the electrical parameter measurement device;
    a common input terminal operatively coupled to the voltage measurement circuitry of the electrical parameter measurement device; and
    reference signal circuitry, comprising:
        a common mode reference voltage source which, in operation, generates an alternating current (AC) reference voltage having a reference frequency, wherein the common mode reference voltage source is electrically coupled to the common input terminal;
        detection circuitry that, in operation,
            detects a first signal present at the voltage test input terminal; and
            detects a second signal present at the common input terminal; and
        processing circuitry that, in operation,
            receives the first and second signals from the detection circuitry;
            processes the first and second signals; and
            determines at least one electrical characteristic of a device under test that is electrically coupled to the voltage test input terminal and the common input terminal based at least in part on the processing of the first and second signals.

2. The electrical parameter measurement device of claim 1, further comprising:
    a display, wherein, in operation, the processing circuitry causes the at least one electrical characteristic to be presented on the display.

3. The electrical parameter measurement device of claim 1 wherein, in operation, the processing circuitry compares a phase of the first signal to a phase of the second signal to determine a measure of impedance of the device under test.

4. The electrical parameter measurement device of claim 1 wherein the common mode reference voltage source is electrically coupled to the common input terminal via a transformer.

5. The electrical parameter measurement device of claim 1 wherein the common mode reference voltage source is directly electrically coupled to the common input terminal.

6. The electrical parameter measurement device of claim 1 wherein the AC reference voltage generated by the common mode reference voltage source has a frequency that is greater than or equal to 500 Hz and less than or equal to 5,000 Hz.

7. The electrical parameter measurement device of claim 1 wherein the electrical parameter measurement device comprises one of an analog multimeter, a digital multimeter, an analog oscilloscope, or a digital oscilloscope.

8. The electrical parameter measurement device of claim 1 wherein, in operation, the processing circuitry determines the presence or absence of a ghost voltage in the device under test based at least in part on the processing of the first and second signals.

9. The electrical parameter measurement device of claim 1 wherein, in operation, the processing circuitry analyzes the first signal to determine a signal magnitude, and determines a loop impedance between the voltage test input terminal and the common input terminal based at least in part on the signal magnitude of the first signal.

10. The electrical parameter measurement device of claim 1 wherein, in operation, the processing circuitry determines at least one of an inductance value or a capacitance value for the device under test based at least in part on the processing of the first and second signals.

11. The electrical parameter measurement device of claim 1 wherein, in operation, the processing circuitry determines whether the device under test is electrically coupled to each of the voltage test input terminal and the common input terminal based at least in part on the processing of the first and second signals.

12. The electrical parameter measurement device of claim 1 wherein the detection circuitry comprises:
    a first voltage divider circuit operatively coupled to the voltage test input terminal;
    a second voltage divider circuit operatively coupled to the common input terminal;
    a first analog-to-digital converter input terminal operatively coupled to an output of the first voltage divider circuit; and
    a second analog-to-digital converter input terminal operatively coupled to an output of the second voltage divider circuit.

13. The electrical parameter measurement device of claim 1 wherein the detection circuitry comprises:
    a first filter circuit operatively coupled to the voltage test input terminal, wherein, in operation, the first filter circuit passes signals that have a frequency within an expected range of frequencies for the device under test; and
    a second filter circuit operatively coupled to the voltage test input terminal, wherein, in operation, the second filter circuit passes signals that have the reference frequency of the common mode reference voltage source.

14. The electrical parameter measurement device of claim 1 wherein the processing circuitry implements a fast Fourier transform (FFT) to obtain a frequency domain representation of the first and second signals.

15. The electrical parameter measurement device of claim 1 wherein the common mode reference voltage source comprises a digital-to-analog converter (DAC).

16. A method of operating an electrical parameter measurement device, the electrical parameter measurement device comprising a housing, voltage measurement circuitry, a voltage test input terminal and a common input terminal operatively coupled to the voltage measurement circuitry, the method comprising:
- causing a common mode reference voltage source to generate an alternating current (AC) reference voltage having a reference frequency, the common mode reference voltage source being electrically coupled to the common input terminal;
- detecting, via detection circuitry of the electrical parameter measurement device, a first signal present at the voltage test input terminal;
- detecting, via the detection circuitry, a second signal present at the common input terminal;
- processing, via processing circuitry of the electrical parameter measurement device, the first and second signals; and
- determining, via the processing circuitry, at least one electrical characteristic of a device under test that is electrically coupled to the voltage test input terminal and the common input terminal based at least in part on the processing of the first and second signals.

17. The method of claim 16, further comprising:
- displaying, on a display of the electrical parameter measurement device, the determined at least one electrical characteristic.

18. The method of claim 16 wherein processing the first and second signals comprises comparing a phase of the first signal to a phase of the second signal to determine a measure of impedance of the device under test.

19. The method of claim 16 wherein determining at least one electrical characteristic comprises determining the presence or absence of a ghost voltage in the device under test based at least in part on the processing of the first and second signals.

20. The method of claim 16 wherein determining at least one electrical characteristic comprises determining at least one of an inductance value or a capacitance value of the device under test based at least in part on the processing of the first and second signals.

21. The method of claim 16 wherein determining at least one electrical characteristic comprises determining whether the device under test is electrically coupled to each of the voltage test input terminal and the common input terminal based at least in part on the processing of the first and second signals.

22. The method of claim 16 wherein determining at least one electrical characteristic comprises implementing a fast Fourier transform (FFT) to obtain a frequency domain representation of the first and second signals.

23. An electrical parameter measurement device, comprising:
- a housing;
- voltage measurement circuitry disposed within the housing;
- a voltage test input terminal operatively coupled to the voltage measurement circuitry;
- a common input terminal operatively coupled to the voltage measurement circuitry;
- a common mode reference voltage source disposed within the housing and electrically coupled to the common input terminal, wherein, in operation, the common mode reference voltage source generates an alternating current (AC) reference voltage having a reference frequency;
- detection circuitry disposed within the housing, wherein, in operation, the detection circuitry detects first and second signals present at the voltage test input terminal and the common input terminal, respectively; and
- processing circuitry disposed within the housing, wherein, in operation, the processing circuitry processes the first and second signals to determine at least one electrical characteristic of a device under test that is electrically coupled to the voltage test input terminal and the common input terminal.

* * * * *